United States Patent
Kim et al.

(10) Patent No.: US 10,608,060 B2
(45) Date of Patent: Mar. 31, 2020

(54) ORGANIC LIGHT EMITTING DIODE DISPLAY AND A METHOD OF MANUFACTURING THE SAME

(71) Applicant: SAMSUNG DISPLAY CO., LTD., Yongin-si, Gyeonggi-Do (KR)

(72) Inventors: Duk-Sung Kim, Asan-si (KR); Byung Seon An, Hwaseong-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 24 days.

(21) Appl. No.: 15/624,775

(22) Filed: Jun. 16, 2017

(65) Prior Publication Data

US 2017/0365649 A1   Dec. 21, 2017

(30) Foreign Application Priority Data

Jun. 17, 2016 (KR) .................. 10-2016-0076040

(51) Int. Cl.
*H01L 27/32* (2006.01)
*H01L 29/417* (2006.01)
(Continued)

(52) U.S. Cl.
CPC ...... *H01L 27/3246* (2013.01); *H01L 27/3248* (2013.01); *H01L 27/3262* (2013.01); *H01L 27/3265* (2013.01); *H01L 27/3276* (2013.01); *H01L 28/60* (2013.01); *H01L 29/41733* (2013.01); *H01L 51/0023* (2013.01); *H01L 51/56* (2013.01); *H01L 27/124* (2013.01); *H01L 27/1222* (2013.01); *H01L 27/1225* (2013.01);
(Continued)

(58) Field of Classification Search
CPC . H01L 51/50–56; H01L 51/0032–0095; H01L 2251/50–568; H01L 27/1222; H01L 27/1225; H01L 27/124; H01L 27/1255; H01L 27/1288; H01L 27/32–3297; B32B 2457/206
See application file for complete search history.

(56) References Cited

U.S. PATENT DOCUMENTS 7,365,488 B2 *   4/2008   Lee ............... H01L 27/3211
                                                257/40
8,338,832 B2 *  12/2012   Kim ............... H01L 27/3202
                                                257/59
(Continued)

FOREIGN PATENT DOCUMENTS

KR       10-1067939      9/2011
KR     10-2012-0019024   3/2012
KR       10-1408687      6/2014

*Primary Examiner* — Maliheh Malek
(74) *Attorney, Agent, or Firm* — F. Chau & Associates, LLC

(57) ABSTRACT

An organic light-emitting diode display including a substrate, a first transistor, and an organic light-emitting element. The first transistor is positioned on the substrate. The first transistor includes a first active layer including a first source region, a first channel region extending from the first source region, a first drain region extending from the first channel region, a first conductive pattern, and a first gate electrode positioned on the first active layer. The organic light-emitting element is connected to the first transistor. The first conductive pattern is in contact with the first active layer and covers the first source region and the second source region.

17 Claims, 11 Drawing Sheets

(51) Int. Cl.
*H01L 51/00* (2006.01)
*H01L 49/02* (2006.01)
*H01L 51/56* (2006.01)
*H01L 29/786* (2006.01)
*H01L 27/12* (2006.01)
*H01L 51/52* (2006.01)

(52) U.S. Cl.
CPC ...... *H01L 27/1255* (2013.01); *H01L 27/1288* (2013.01); *H01L 29/7869* (2013.01); *H01L 51/5206* (2013.01); *H01L 51/5221* (2013.01); *H01L 2227/323* (2013.01)

(56) References Cited

U.S. PATENT DOCUMENTS

| Patent/Pub No. | Kind | Date | Inventor | Classification |
|---|---|---|---|---|
| 8,575,598 | B2* | 11/2013 | Kwon | H01L 51/5218 257/40 |
| 8,872,181 | B2* | 10/2014 | Park | H01L 27/124 257/59 |
| 9,112,177 | B2* | 8/2015 | Shim | H01L 51/5056 |
| 9,129,927 | B2* | 9/2015 | Gupta | H01L 27/3262 |
| 9,263,679 | B2* | 2/2016 | You | H01L 29/786 |
| 9,373,671 | B2* | 6/2016 | You | H01L 27/3265 |
| 9,478,586 | B2* | 10/2016 | Lee | G09G 3/3233 |
| 9,741,778 | B2* | 8/2017 | You | H01L 27/3265 |
| 10,020,354 | B2* | 7/2018 | Kim | H01L 27/3262 |
| 10,084,029 | B2* | 9/2018 | Lee | G09G 3/3233 |
| 10,134,821 | B2* | 11/2018 | Lee | H01L 27/3262 |
| 2003/0214006 | A1* | 11/2003 | Nakamura | G02F 1/136286 257/448 |
| 2005/0017247 | A1* | 1/2005 | Koo | H01L 27/3276 257/72 |
| 2005/0200270 | A1* | 9/2005 | Kwak | H01L 27/3276 313/502 |
| 2005/0269942 | A1* | 12/2005 | Ahn | H01L 27/322 313/503 |
| 2006/0091399 | A1* | 5/2006 | Lee | H01L 27/12 257/72 |
| 2006/0157836 | A1* | 7/2006 | Park | H01L 27/1214 257/678 |
| 2007/0176176 | A1* | 8/2007 | Yamazaki | H01L 27/3248 257/59 |
| 2007/0238227 | A1* | 10/2007 | Jun | H01L 27/1255 438/149 |
| 2008/0246027 | A1* | 10/2008 | Kim | H01L 27/3211 257/40 |
| 2009/0065767 | A1* | 3/2009 | Reynolds | H01L 27/3262 257/40 |
| 2009/0315455 | A1* | 12/2009 | Wang | H01L 27/3274 313/504 |
| 2010/0224881 | A1* | 9/2010 | Park | H01L 27/3265 257/71 |
| 2011/0017999 | A1* | 1/2011 | Choi | G02F 1/1368 257/72 |
| 2011/0025659 | A1* | 2/2011 | Kwak | G09G 3/3233 345/205 |
| 2011/0079786 | A1* | 4/2011 | Kwon | H01L 27/3262 257/71 |
| 2011/0248276 | A1* | 10/2011 | Son | H01L 21/0245 257/65 |
| 2011/0248279 | A1* | 10/2011 | Park | H01L 29/66765 257/72 |
| 2011/0291091 | A1* | 12/2011 | Kim | H01L 27/3265 257/57 |
| 2011/0297944 | A1* | 12/2011 | Choi | H01L 27/124 257/59 |
| 2012/0105388 | A1* | 5/2012 | Han | G09G 3/325 345/204 |
| 2012/0229437 | A1* | 9/2012 | Park | H01L 27/3276 345/211 |
| 2012/0326150 | A1* | 12/2012 | Kim | H01L 27/3258 257/59 |
| 2013/0001564 | A1* | 1/2013 | Choi | H01L 27/3276 257/59 |
| 2013/0015457 | A1* | 1/2013 | You | H01L 27/1288 257/71 |
| 2013/0161632 | A1* | 6/2013 | You | H01L 27/3276 257/72 |
| 2013/0293236 | A1* | 11/2013 | Lee | G09G 3/006 324/414 |
| 2014/0027726 | A1* | 1/2014 | Choi | H01L 51/5203 257/40 |
| 2014/0042394 | A1* | 2/2014 | Lee | H01L 51/5203 257/40 |
| 2014/0054562 | A1* | 2/2014 | Lee | H01L 27/124 257/40 |
| 2014/0061606 | A1* | 3/2014 | Kim | H01L 23/48 257/40 |
| 2014/0103308 | A1* | 4/2014 | Choi | H01L 51/5262 257/40 |
| 2014/0111404 | A1* | 4/2014 | Omata | H05B 33/08 345/76 |
| 2014/0131677 | A1* | 5/2014 | Oh | H01L 51/5228 257/40 |
| 2014/0191219 | A1* | 7/2014 | Kim | H01L 27/3206 257/40 |
| 2014/0239270 | A1* | 8/2014 | Ko | H01L 27/1255 257/40 |
| 2014/0267999 | A1* | 9/2014 | Kim | G02F 1/1345 349/152 |
| 2014/0299842 | A1* | 10/2014 | Kim | H01L 29/78678 257/40 |
| 2014/0346448 | A1* | 11/2014 | You | H01L 51/5228 257/40 |
| 2015/0102316 | A1* | 4/2015 | Park | H01L 27/3258 257/40 |
| 2015/0115256 | A1* | 4/2015 | You | H01L 27/3265 257/40 |
| 2015/0123084 | A1* | 5/2015 | Kim | H01L 27/326 257/40 |
| 2015/0144905 | A1* | 5/2015 | Kim | H01L 29/7831 257/40 |
| 2015/0171147 | A1* | 6/2015 | You | H01L 29/786 257/40 |
| 2015/0171154 | A1* | 6/2015 | Kang | H01L 23/53238 257/40 |
| 2015/0187853 | A1* | 7/2015 | Jin | H01L 27/3262 257/40 |
| 2016/0012775 | A1* | 1/2016 | Jeong | H01L 27/3276 345/690 |
| 2016/0020333 | A1* | 1/2016 | Gao | H01L 29/78678 257/71 |
| 2016/0035805 | A1* | 2/2016 | Kim | H01L 27/3262 345/76 |
| 2016/0056225 | A1* | 2/2016 | Lee | H01L 27/3279 257/40 |
| 2016/0064425 | A1* | 3/2016 | Kim | H01L 27/1255 438/151 |
| 2016/0064462 | A1* | 3/2016 | Yoon | H01L 27/1255 257/40 |
| 2016/0064467 | A1* | 3/2016 | Ota | H01L 27/3276 257/40 |
| 2016/0079333 | A1* | 3/2016 | Shishido | H01L 27/3218 257/72 |
| 2016/0093645 | A1* | 3/2016 | Lee | H01L 51/5246 257/43 |
| 2016/0104420 | A1* | 4/2016 | Park | G09G 3/3225 345/76 |
| 2016/0104758 | A1* | 4/2016 | Kim | H01L 28/60 257/40 |
| 2016/0141350 | A1* | 5/2016 | Kim | H01L 27/3276 257/40 |
| 2016/0141558 | A1* | 5/2016 | Cha | H01L 51/56 257/40 |
| 2016/0190224 | A1* | 6/2016 | Kim | H01L 27/124 257/40 |
| 2016/0226013 | A1* | 8/2016 | Liu | H01L 51/5209 |
| 2016/0284777 | A1* | 9/2016 | You | H01L 27/3265 |

(56) References Cited

U.S. PATENT DOCUMENTS

| | | | |
|---|---|---|---|
| 2016/0307988 A1* | 10/2016 | Kim | H01L 27/3262 |
| 2016/0322448 A1* | 11/2016 | Kim | H01L 29/7869 |
| 2016/0322449 A1* | 11/2016 | Pyon | H01L 27/3276 |
| 2016/0322450 A1* | 11/2016 | Lee | H01L 27/10882 |
| 2016/0343828 A1* | 11/2016 | Hsu | H01L 29/458 |
| 2016/0372534 A1* | 12/2016 | Lee | H01L 27/3276 |
| 2017/0005156 A1* | 1/2017 | Kim | H01L 27/3262 |
| 2017/0012094 A1* | 1/2017 | Lee | G09G 3/3233 |
| 2017/0025487 A1* | 1/2017 | Byun | H01L 27/3276 |
| 2017/0033171 A1* | 2/2017 | Kim | H01L 27/3262 |
| 2017/0033306 A1* | 2/2017 | Song | H01L 51/5265 |
| 2017/0047390 A1* | 2/2017 | Lee | H01L 27/3265 |
| 2017/0047391 A1* | 2/2017 | You | H01L 27/3276 |
| 2017/0053591 A1* | 2/2017 | Seo | G09G 3/3225 |
| 2017/0062528 A1* | 3/2017 | Aoyama | H01L 27/322 |
| 2017/0077203 A1* | 3/2017 | Hsu | H01L 29/458 |
| 2017/0117349 A1* | 4/2017 | Jeon | H01L 27/3279 |
| 2017/0125502 A1* | 5/2017 | Ota | G02B 27/017 |
| 2017/0141355 A1* | 5/2017 | Hsu | H01L 27/12 |
| 2017/0148861 A1* | 5/2017 | Kim | H01L 27/3211 |
| 2017/0155080 A1* | 6/2017 | Jo | H01L 27/323 |
| 2017/0170252 A1* | 6/2017 | Kim | H01L 27/3262 |
| 2017/0192571 A1* | 7/2017 | Kim | G02F 1/133345 |
| 2017/0200742 A1* | 7/2017 | Shin | H01L 27/127 |
| 2017/0207289 A1* | 7/2017 | Kang | H01L 27/3246 |
| 2017/0221762 A1* | 8/2017 | Cai | H01L 21/77 |
| 2017/0221979 A1* | 8/2017 | Chae | H01L 27/3262 |
| 2017/0244052 A1* | 8/2017 | Park | C09D 183/06 |
| 2017/0269783 A1* | 9/2017 | Yang | G06F 3/0412 |
| 2017/0288003 A1* | 10/2017 | Kim | H01L 27/124 |
| 2017/0294464 A1* | 10/2017 | Kwon | G02F 1/13624 |
| 2017/0338295 A1* | 11/2017 | Lee | G09G 3/3225 |
| 2017/0343843 A1* | 11/2017 | Kim | G02F 1/133345 |
| 2018/0006105 A1* | 1/2018 | Kim | G09G 3/3258 |
| 2018/0012950 A1* | 1/2018 | Jung | H01L 27/3272 |
| 2018/0033883 A1* | 2/2018 | Zhou | H01L 21/77 |
| 2018/0096666 A1* | 4/2018 | Chung | G09G 3/3688 |
| 2018/0159090 A1* | 6/2018 | Cha | H01L 51/56 |
| 2018/0175128 A1* | 6/2018 | Lee | H01L 27/3262 |
| 2018/0254311 A1* | 9/2018 | Yamazaki | H01L 27/3246 |
| 2018/0284927 A1* | 10/2018 | Kim | G06F 3/044 |
| 2018/0286936 A1* | 10/2018 | Lee | H01L 27/3258 |
| 2018/0315801 A1* | 11/2018 | Matsueda | H01L 27/3218 |
| 2018/0331124 A1* | 11/2018 | Cho | G09G 3/3233 |
| 2018/0331171 A1* | 11/2018 | Kim | H01L 51/5234 |
| 2018/0374879 A1* | 12/2018 | Jeon | H01L 29/41733 |
| 2019/0304356 A1* | 10/2019 | Ka | G02F 1/1333 |

* cited by examiner

ORGANIC LIGHT EMITTING DIODE DISPLAY AND A METHOD OF MANUFACTURING THE SAME

CROSS-REFERENCE TO RELATED APPLICATION

This application claims priority under 35 U.S.C. § 119 to Korean Patent Application No. 10-2016-0076040 filed in the Korean Intellectual Property Office on Jun. 17, 2016, the disclosure of which is incorporated by reference herein in its entirety.

TECHNICAL FIELD

Exemplary embodiments of the present invention relate to an organic light-emitting diode display, and more particularly to a method of manufacturing the same.

DISCUSSION OF RELATED ART

Types of display devices include organic light-emitting diode (OLED) displays, liquid crystal displays (LCD), and plasma display panels (PDP).

The OLED display includes a substrate, a plurality of wires, and a plurality of organic light-emitting elements. The plurality of wires are connected to the substrate. The plurality of organic light-emitting element are connected to the plurality of wires.

To decrease each of a manufacturing time and costs, wires included in the plurality of wires of the OLED display are formed on a substrate by using a micro-electro-mechanical systems (MEMS) technique, for example, a photolithography process.

SUMMARY

An exemplary embodiment of the present invention provides an organic light-emitting diode (OLED) display, and a manufacturing method thereof in which each of a manufacturing time and costs may be reduced.

An exemplary embodiment of the present invention provides an OLED display having an increased area of a light emission region of an organic light-emitting element, and a manufacturing method thereof.

An exemplary embodiment of the present invention provides an organic light-emitting diode display. The organic light-emitting diode display includes a substrate, a first transistor, and an organic light-emitting element. The first transistor is positioned on the substrate. The first transistor includes a first active layer. The first active layer includes a first source region, a first channel region, a first drain region, a first conductive pattern, and a first gate electrode. The first channel region extends from the first source region. The first drain region extends from the first channel region. The first gate electrode is positioned on the first active layer. The organic light-emitting element is connected to the first transistor. The first conductive pattern is in contact with the first active layer. The first conductive pattern covers the first source region and the first drain region.

The first conductive pattern may not overlap the first channel region.

The organic light-emitting diode display may further include a second transistor, a second channel region, a second source region, a second conductive pattern, and a second gate electrode. The second transistor may include a second active layer. The second active layer may include a second drain region. The second drain region may be connected to the first gate electrode. The second channel region may extend from the second drain region. The second source region may extend from the second channel region. The second conductive pattern may be in contact with the second active layer. The second conductive pattern may cover the second source region and the second drain region. The second gate electrode may be positioned on the second active layer.

The second conductive pattern may not overlap the second channel region.

The second active layer may be positioned at the same layer as the first active layer. The second conductive pattern may be positioned at the same layer as the first conductive pattern.

The organic light-emitting diode display may further include a first capacitor electrode and a second capacitor electrode. The first capacitor electrode may include a first capacitor pattern. The first capacitor pattern may connect the first gate electrode and the second drain region to each other. The second capacitor pattern may be in contact with the first capacitor pattern. The second capacitor pattern may cover the first capacitor pattern. The second capacitor electrode may be positioned on the first capacitor electrode. The second capacitor electrode may connect the first drain region and the organic light-emitting element to each other. The first capacitor electrode may be disposed at the same layer as the first active layer and the second active layer.

The second capacitor pattern may be positioned at the same layer as the first conductive pattern and the second conductive pattern. The second capacitor electrode may be positioned at the same layer as the first gate electrode and the second gate electrode.

The organic light-emitting diode display may further include a data line. The data line may extend in a first direction along a substrate. The data line may include a first data pattern and a second data pattern. The first data pattern may be connected to the second source region. The first data pattern may be positioned at the same layer as the second active layer. The second data pattern may be in contact with the first data pattern. The second data pattern may cover the first data pattern.

The second data pattern may be positioned at the same layer as the first conductive pattern and the second conductive pattern.

The organic light-emitting diode display may further include a scan line. The scan line may extend in a second direction along the substrate. The scan line may be connected to the second gate electrode. The scan line may be positioned at the same layer as the second gate electrode. The second direction may cross the first direction.

The organic light-emitting diode display may further include a driving power source line disposed on the substrate. The driving power source line may be separated from the scan line. The driving power source line may extend in the second direction. The driving power source line may be connected to the first source region. The driving power source line may be positioned at the same layer as the scan line.

The organic light-emitting diode display may further include a bypass line disposed on the substrate. The bypass line may be separated from the scan line and the driving power source line. The bypass line may extend in the second direction. The bypass line may be connected to the organic light-emitting element. The bypass line may be disposed at the same layer as the driving power source line.

The organic light-emitting element may include a first electrode, an organic emission layer, a second electrode, and a pixel definition layer. The first electrode may be connected to the first transistor. The organic emission layer may be positioned on the first electrode. The second electrode may be positioned on the organic emission layer. The pixel definition layer may include an opening. The opening may overlap a part of the first electrode.

The first electrode may include a plurality of first electrodes. The pixel definition layer may include a depressed portion. The depressed portion may overlap between adjacent first electrodes.

The surface of the pixel definition layer may have a curved shape.

The first active layer may include polysilicon or an oxide semiconductor.

The first conductive pattern may have an island shape.

A method of manufacturing an organic light-emitting diode display according to an exemplary embodiment of the present invention includes forming a semiconductor pattern and a first metal pattern on a substrate. A first insulating layer is formed on the first metal pattern. The first insulating layer includes a first contact hole. The first contact hole overlaps a portion of the first metal pattern. A second metal pattern is formed on the first insulating layer. A second insulating layer is formed on the second metal pattern. The second insulating layer includes a second contact hole. The second contact hole overlaps a part of the second metal pattern. An organic light-emitting element is formed on the second insulating layer. The organic light-emitting element is in contact with the second metal pattern through the second contact hole. The first metal pattern is in contact with the semiconductor pattern. The first metal pattern covers a part of the semiconductor pattern. The second metal pattern is in contact with the first metal pattern through the first contact hole.

Forming the semiconductor pattern and the first metal pattern may be performed using a half-tone mask.

Forming the organic light-emitting element may include forming a first electrode layer and an organic layer on the second insulating layer. The organic layer covers the first electrode layer. Forming the organic light-emitting element may also include etching the first electrode layer and the organic layer using a half-tone mask and reflowing the etched organic layer using heat.

BRIEF DESCRIPTION OF THE DRAWINGS

These and/or other features of the present invention will become more apparent by describing in detail exemplary embodiments thereof, with reference to the accompanying drawings, in which.

DETAILED DESCRIPTION OF THE EMBODIMENTS

Figure 1:
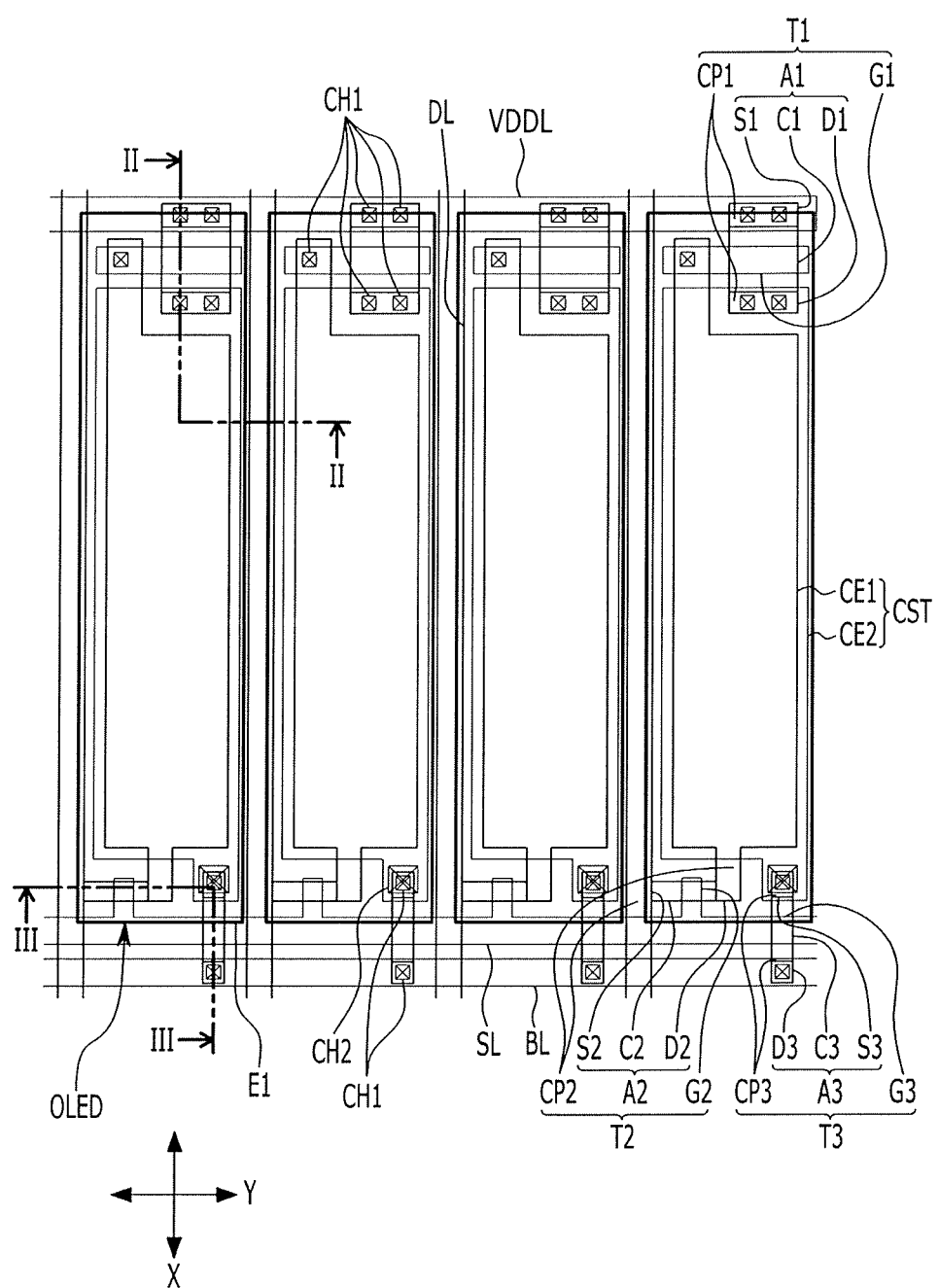
FIG. 1 is a layout view illustrating an organic light-emitting diode display according to an exemplary embodiment of the present invention.

One or more exemplary embodiments of the present invention will be described more fully hereinafter with reference to the accompanying drawings. As those skilled in the art would realize, the described exemplary embodiments may be modified in various different ways, and thus, is not limited thereto.

The drawings and description are to be regarded as illustrative in nature and not restrictive. Like reference numerals may refer to like elements throughout the specification and drawings.

It will be understood that when an element such as a layer, film, region, or substrate is referred to as being "on" another element, it can be directly on the other element or intervening elements may also be present.

An organic light-emitting diode display according to an exemplary embodiment of the present invention will be described in more detail below with reference to FIGS. 1 to 3.

FIG. 1 is a layout view illustrating an organic light-emitting diode display according to an exemplary embodiment of the present invention. FIG. 2 is a cross-sectional view taken along a line II-II of FIG. 1 according to an exemplary embodiment of the present invention. FIG. 3 is a cross-sectional view taken along a line of FIG. 1 according to an exemplary embodiment of the present invention.

Figure 2:
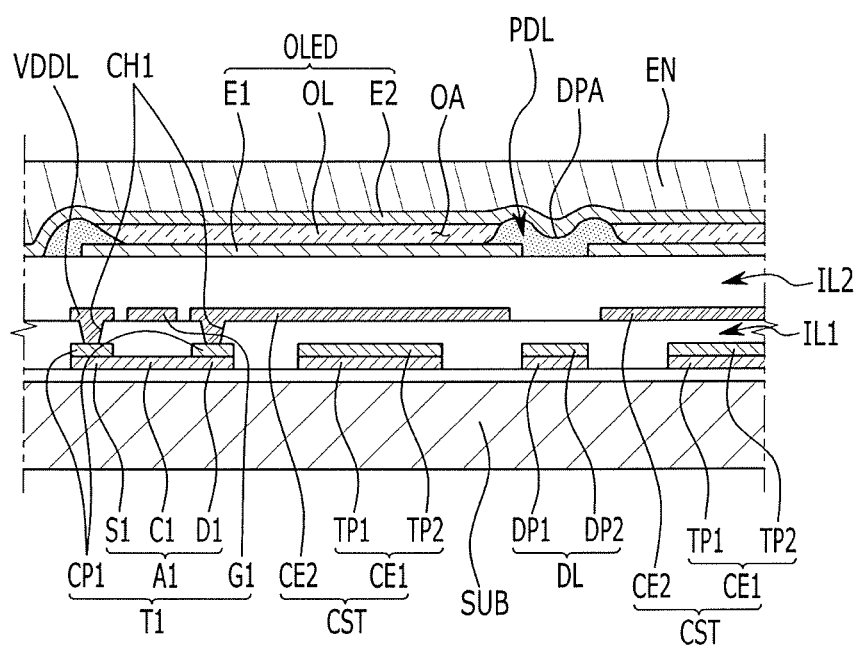
FIG. 2 is a cross-sectional view taken along a line II-II of FIG. 1 according to an exemplary embodiment of the present invention.
Figure 3:
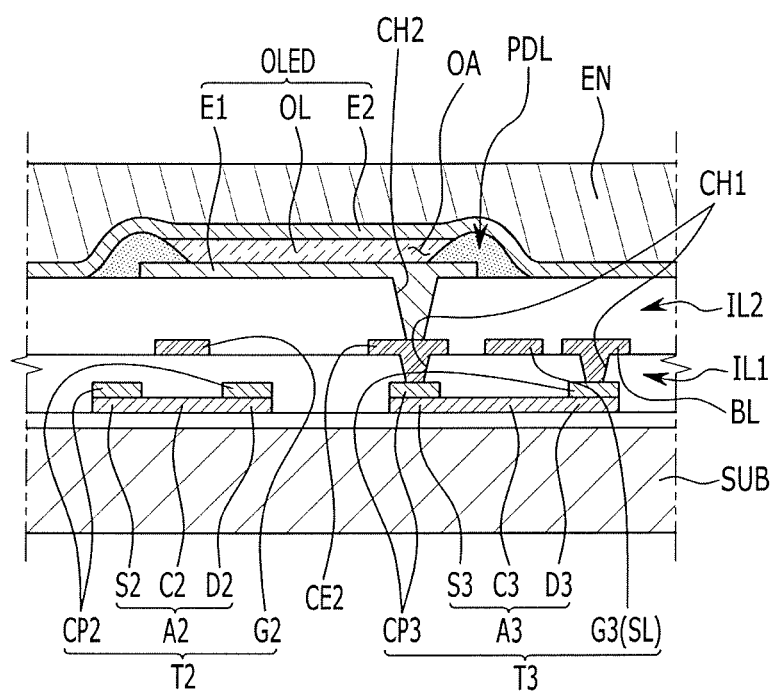
FIG. 3 is a cross-sectional view taken along a line of FIG. 1 according to an exemplary embodiment of the present invention.

Referring to FIGS. 1 to 3, an organic light-emitting diode display may include a substrate SUB, a first transistor T1, a second transistor T2, a third transistor T3, a capacitor CST, a data line DL, a scan line SL, a driving power source line VDDL, a bypass line BL, a first insulating layer IL1, a second insulating layer IL2, an organic light-emitting element OLED, a pixel definition layer PDL, and an encapsulation part EN.

The substrate SUB may be an insulating substrate. The substrate SUB may include a glass or a polymer. The substrate SUB may be flexible, stretchable, foldable, bendable, or rollable.

The data line DL may extend in a first direction (e.g., an X-axis direction) along the substrate SUB. The scan line SL, the driving power source line VDDL, and the bypass line BL may be respectively separated from each other. The scan line SL, the driving power source line VDDL, and the bypass line BL may each extend in a second direction (e.g., a Y-axis direction) along the substrate SUB. The second direction (e.g., the Y-axis direction) may cross the first direction (e.g., the X-axis direction).

The second thin film transistor T2 may be connected to the data line DL. The scan line SL may be connected to a second gate electrode G2 of the second thin film transistor T2. The scan line SL may be connected to a third gate electrode G3 of the third thin film transistor T3. The first thin film transistor T1 may be connected to the driving power source line VDDL. The third thin film transistor T3 may be connected to the bypass line BL.

The first transistor T1 may be disposed on the substrate SUB. The first transistor T1 may be configured to switch between the driving power source line VDDL and the second capacitor electrode CE2 of the capacitor CST. The first transistor may be connected to the organic light-emitting element OLED, for example, through the second capacitor electrode CE2. Accordingly, the first transistor T1 may be configured to switch between the driving power source line VDDL and the organic light-emitting element OLED.

The first transistor T1 may include a first active layer A1, a first conductive pattern CP1, and a first gate electrode G1.

The first active layer A1 may include a first source region S1, a first channel region C1, and a first drain region D1.

The first source region S1 may be connected to the driving power source line VDDL, for example, through a first contact hole CH1 of the first insulating layer IL1.

The first channel region C1 may extend from the first source region S1. The first channel region C1 may connect the first source region S1 and the first drain region D1 to each other.

The first drain region D1 may extend from the first channel region C1. The first drain region D1 may be connected to the second capacitor electrode CE2 of the capacitor CST, for example, through the first contact hole CH1 of the first insulating layer IL1.

The first active layer A1 may include a polysilicon or an oxide semiconductor. The oxide semiconductor may include one of oxides based on titanium (Ti), hafnium (Hf), zirconium (Zr), aluminum (Al), tantalum (Ta), germanium (Ge), zinc (Zn), gallium (Ga), tin (Sn), or indium (In), zinc oxide (ZnO), indium-gallium-zinc oxide (InGaZnO4), indium zinc oxide (Zn—In—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), or hafnium-indium-zinc oxide (Hf—In—Zn—O) which are complex oxides thereof. When the first active layer A1 includes the oxide semiconductor, a separate passivation layer may be provided. The passivation layer may be configured to protect the oxide semiconductor from external environmental conditions, such as a high temperature.

The first channel region C1 of the first active layer A1 may be doped with an N-type impurity or a P-type impurity. The first source region S1 and the first drain region D1 may be separated from each other, for example, via the first channel region C1. The first source region S1 and the first channel region C1 may each be doped with a doping impurity of a type opposite to the doping impurity doped to the first channel region C1. For example, when the first channel region C1 of the first active layer A1 is doped with an N-type impurity, the first source region S1 and the first channel region C1 may each be doped with a P-type impurity. When the first channel region C1 of the first active layer A1 is doped with a P-type impurity, the first source region S1 and the first channel region A1 may each be doped with an N-type impurity.

The first conductive pattern CP1 may be in direct contact with an upper surface of the first active layer A1. The entire first conductive pattern CP1 may overlap the first active layer A1. The first conductive pattern CP1 may have a single layered structure or a multi-layered structure. The first conductive pattern CP1 may include a conductive material, such as a metal. The first conductive pattern CP1 may cover each of the first source region S1 and the first drain region D1 of the first active layer A1. The first conductive pattern CP1 might not overlap with the first channel region C1. The first conductive pattern CP1 may be substantially simultaneously formed with the first active layer A1, for example, by using a half-tone mask. The first conductive pattern CP1 may have an island shape.

The first gate electrode G1 may be disposed on the first channel region C1 of the first active layer A1. The first gate electrode G1 may be connected to the first capacitor electrode CE1 of the capacitor CST, for example, through the first contact hole CH1 of the first insulating layer IL1.

The second transistor T2 may be configured to switch between the data line DL and the first capacitor electrode CE1 of the capacitor CST. The second transistor T2 may be connected to the first gate electrode G1 of the first transistor T1, for example, through the first capacitor electrode CE1. Accordingly, the second transistor T2 may be configured to switch between the data line DL and the first gate electrode G1.

The second transistor T2 may include a second active layer A2, a second conductive pattern CP2, and a second gate electrode G2.

The second active layer A2 may include a second source region S2, a second channel region C2, and a second drain region D2.

The second source region S2 may extend from the data line DL. The second source region S2 may be connected to the data line DL.

The second channel region C2 may extend from the second source region S2. The second channel region C2 may connect the second source region S2 and the second drain region D2 to each other.

The second drain region D2 may extend from the second channel region C2. The second drain region D2 may be connected to the first gate electrode G1 of the first transistor T1, for example, through the first capacitor electrode CE1.

The second active layer A2 may include the polysilicon or the oxide semiconductor.

The second channel region C2 of the second active layer A2 may be channel-doped with the N-type impurity or the P-type impurity. The second source region S2 and the second drain region D2 may be separated from each other, for example, via the second channel region C2. The second source region S2 and the second drain region D2 may each be doped with the doping impurity of the type opposite to a doping impurity doped to the second channel region C2. For example, when the second channel region C2 of the second active layer A2 is doped with an N-type impurity, the second source region S2 and the second channel region C2 may each be doped with a P-type impurity. When the second channel region C2 of the second active layer A2 is doped with a P-type impurity, the second source region S2 and the second channel region A2 may each be doped with an N-type impurity.

The second active layer A2 may be disposed on the same layer as the first active layer A1.

The second conductive pattern CP2 may be in direct contact with the upper surface of the second active layer A2. The entire second conductive pattern CP2 may overlap the second active layer A2. The second conductive pattern CP2 may have a single layered structure or a multi-layered. The second conductive pattern CP2 may include a conductive material, such as a metal. The second conductive pattern CP2 may cover each of the second source region S2 and the second drain region D2 of the second active layer A2. The second conductive pattern CP2 might not overlap with the second channel region C2. The second conductive pattern CP2 may be simultaneously formed with the second active layer A2, for example, by using a half-tone mask. The second conductive pattern CP2 may have an island shape.

The second conductive pattern CP2 may be disposed on the substrate SUB at the same layer as the first conductive pattern CP1.

The second gate electrode G2 may be disposed on the second channel region C2 of the second active layer A2. The second gate electrode G2 may extend from the scan line SL. The second gate electrode G1 may be connected to the scan line SL.

The third transistor T3 may be configured to switch each of the second capacitor electrode CE2 of the capacitor CST and the bypass line BL. The third transistor T3 may be connected to the first electrode E1 of the organic light-emitting element OLED, for example, through the second capacitor electrode CE2. Accordingly, the third transistor T3 may be configured to switch between the first electrode E1 and the bypass line BL.

The third transistor T3 may include a third active layer A3, a third conductive pattern CP3, and a third gate electrode G3.

The third active layer A3 may include a third source region S3, a third channel region C3, and a third drain region D3.

The third source region S3 may be connected to the second capacitor electrode CE2 of the capacitor CST, for example, through the first contact hole CH1 of the first insulating layer IL1. The third source region S3 may be connected to the first electrode E1 of the organic light-emitting element OLED, for example, through the second contact hole CH2 of the second insulating layer IL2. Thus, the third source region S3 may be connected to the first electrode E1 of the organic light-emitting element OLED.

The third channel region C3 may extend from the third source region S3. The third channel region C2 may connect the third source region S3 and the third drain region D3 to each other.

The third drain region D3 may extend from the third channel region C3. The third drain region D3 may be connected to the bypass line BL, for example, through the first contact hole CH1 of the first insulating layer IL1.

The third active layer A3 may include the polysilicon or the oxide semiconductor.

The third channel region C3 of the third active layer A3 may be channel-doped with the N-type impurity or the P-type impurity. The third source region S3 and the third drain region D3 may be separated from each other, for example, via the third channel region C3. The third source region S3 and the third drain region D3 may each be doped with a doping impurity of the type opposite to the doping impurity doped to the third channel region C3. For example, when the third channel region C3 of the third active layer A3 is doped with an N-type impurity, the third source region S3 and the third channel region C3 may each be doped with a P-type impurity. When the third channel region C3 of the third active layer A3 is doped with a P-type impurity, the third source region S3 and the third channel region A3 may each be doped with an N-type impurity.

The third active layer A3 may be disposed on the substrate SUB at substantially the same layer as the first active layer A1 and the second active layer A2.

The third conductive pattern CP3 may be in direct contact with the upper surface of the third active layer A3. The entire third conductive pattern CP3 may overlap the third active layer A3. The third conductive pattern CP3 may have a single layered structure or a multi-layered structure. The third conductive pattern CP3 may include a conductive material, such as a metal. The third conductive pattern CP3 may cover each of the third source region S3 and the third drain region D3 of the third active layer A3. The third conductive pattern CP3 might not overlap with the third channel region C3. The third conductive pattern CP3 may be simultaneously formed with the third active layer A3, for example, by using a half-tone mask. The third conductive pattern CP3 may have an island shape.

The third conductive pattern CP3 may be disposed on the substrate SUB at the same layer as each of the first conductive pattern CP1 and the second conductive pattern CP2.

The third gate electrode G3 may be disposed on the third channel region C3 of the third active layer A3. The third gate electrode G3 may be disposed to be separated from the scan line SL. The third gate line G3 may be connected to the scan line SL.

The capacitor CST may include a first capacitor electrode CE1 and a second capacitor electrode CE2.

The first capacitor electrode CE1 may connect the first gate electrode G1 and the second drain region D2 to each other. The first capacitor electrode CE1 may be connected to the first gate electrode G1, for example, through the first contact hole CH1 of the first insulating layer IL1. The first capacitor electrode CE1 may include a first capacitor pattern TP1 and a second capacitor pattern TP2.

The first capacitor pattern TP1 may be disposed on the substrate SUB at the same layer as each of the first active layer A1, the second active layer A2, and the third active layer A3. The first capacitor pattern TP1 may be integrally formed with the second active layer A2.

The second capacitor pattern TP2 may be in direct contact with the upper surface of the first capacitor pattern TP1. The entire second capacitor pattern TP2 may overlap the first capacitor pattern TP1. The second capacitor pattern TP2 may have a single layered structure or a multi-layered structure. The second capacitor pattern TP2 may include a conductive material, such as a metal. The second capacitor pattern TP2 may be simultaneously formed with the first capacitor pattern TP1, for example, by using a half-tone mask. The second capacitor pattern TP2 may have an island shape.

The second capacitor pattern TP2 may be disposed on the substrate SUB at the same layer as each of the first conductive pattern CP1, the second conductive pattern CP2, and the third conductive pattern CP3.

The second capacitor electrode CE2 may be disposed on the first capacitor electrode CE1, for example, via the second insulating layer IL2. The second capacitor electrode CE2 may connect the first drain region D1 of the first transistor T1 and the first electrode E1 of the organic light-emitting element OLED to each other. The second capacitor electrode CE2 may be connected to the first drain region D1, for example, through the first contact hole CH1 of the first insulating layer IL1. The second capacitor electrode CE2 may be connected to the first electrode E1 of the organic light-emitting element OLED, for example, though the second contact hole CH2 of the second insulating layer IL2.

The second capacitor electrode CE2 may be disposed on the substrate SUB at the same layer as each of the driving power source line VDDL, the first gate electrode C1, the second gate electrode G2, the third gate electrode G3, the scan line SL, and the bypass line BL.

The data line DL may extend along the substrate SUB in the first direction (e.g., the X-axis direction). The data line DL may be connected to the second source region S2 of the second transistor T2. The data line DL may include a first data pattern DP1 and a second data pattern DP2.

The first data pattern DP1 may be disposed on the substrate SUB at the same layer as each of the first active layer A1, the second active layer A2, and the third active layer A3. The data pattern DP1 may be integrally formed with the second active layer A2.

The second data pattern DP2 may be in direct contact with the upper surface of the first data pattern DP1. The entire second data pattern DP2 may overlap the first data pattern DP1. The second data pattern DP2 may have a single layered structure or a multi-layered structure. The second data pattern DP2 may include a conductive material, such as a metal. The second data pattern DP2 may be simultaneously formed with the first data pattern DP1, for example, by using a half-tone mask.

The second data pattern DP2 may be disposed on the substrate SUB at the same layer as each of the first conductive pattern CP1, the second conductive pattern CP2, the third conductive pattern CP3, and the second capacitor pattern TP2.

The scan line SL may extend in the second direction (e.g., the Y-axis direction) along the substrate SUB. The second direction (e.g., the Y-axis direction) may cross the first direction (e.g., the X-axis direction). The scan line SL may be connected to each of the second gate electrode G2 and the third gate electrode G3. The scan line SL may be disposed on the substrate SUB at the same layer as each of the first gate electrode G1, the second gate electrode G2, the third gate electrode G3, the second capacitor electrode CE2, the driving power source line VDDL, and the bypass line BL.

The driving power source line VDDL may be disposed to be separated from the scan line SL on the substrate SUB. The driving power source line VDDL may extend in the second direction (e.g., the Y-axis direction). The driving power source line VDDL may be connected to the first source region S1 of the first transistor T1, for example, through the first contact hole CH1 of the first insulating layer IL1. The driving power source line VDDL may be disposed on the substrate SUB at substantially the same layer as each of the scan line SL, the first gate electrode C1, the second gate electrode G2, the third gate electrode G3, the second capacitor electrode CE2, and the bypass line BL.

The bypass line BL may be disposed to be separated from the scan line SL and the driving power source line VDDL on the substrate SUB. The bypass line BL may extend in the second direction (e.g., the Y-axis direction). The bypass line BL may be connected to the first electrode E1 of the organic light-emitting element OLED, for example, through each of the third transistor T3 and the second capacitor electrode CE2. The bypass line BL may be disposed on the substrate SUB at the same layer as each of the driving power source line VDDL, the scan line SL, the first gate electrode G1, the second gate electrode G2, the third gate electrode G3, and the second capacitor electrode CE2.

The first insulating layer IL1 may cover each of the first active layer A1, the first conductive pattern CP1, the second active layer A2, the second conductive pattern CP2, the third active layer A3, the third conductive pattern CP3, the data line DL, and the first capacitor electrode CE1. The first insulating layer IL1 may include a plurality of first contact holes CH1. The plurality of first contact holes CH1 may overlap each of the first capacitor electrode CE1, the first conductive pattern CP1, and the third conductive pattern CP3.

The second insulating layer IL2 may cover each of the driving power source line VDDL, the first gate electrode C1, the second gate electrode G2, the third gate electrode G3, the scan line SL, the bypass line BL, and the second capacitor electrode CE2.

The second insulating layer IL2 may include a second contact hole CH2. The second contact hole CH2 may overlap a portion of the second capacitor electrode CE2.

The organic light-emitting element OLED may be connected to the first transistor T1, for example, through the second capacitor electrode CE2. The organic light-emitting element OLED may include the first electrode E1, the organic emission layer OL, and the second electrode E2.

The first electrode E1 may be connected to the second capacitor electrode CE2, for example, through the second contact hole CH2 of the second insulating layer IL2. The first electrode E1 may be connected to the first transistor T1, for example, through the second capacitor electrode CE2. The first electrode E1 may be a plurality of first electrodes E1. The plurality of first electrodes E1 may be respectively separated from each other. The organic emission layer OL may be disposed on the first electrode E1. The organic emission layer OL may be disposed between the first electrode E1 and the second electrode E2. The second electrode E2 may be disposed on the organic emission layer OL. At least one electrode of the first electrode E1 and the second electrode E2 may be a light transmission electrode, a light reflection electrode, or a light translucent electrode. Light emitted from the organic emission layer OL may be emitted in at least one electrode direction of the first electrode E1 or the second electrode E2.

The first electrode E1 may be disposed on the substrate SUB at a different layer from each of the first transistor T1, the second transistor T2, the third transistor T3, the capacitor CST, the data line DL, the scan line SL, the driving power source line VDDL, and the bypass line BL.

Accordingly, an area of the first electrode E1 may be increased due to a reduced interference with other elements of the OLED display. By increasing the area of the first electrode E1, the light emission region of the organic light-emitting element OLED may increased.

The pixel definition layer PDL may have an opening OA. The opening OA may overlap the portion of the first electrode E1. The pixel definition layer PDL may cover an end of the first electrode E1. Thus, the pixel definition layer PDL may reduce or prevent a short between adjacent first electrodes E1. The pixel definition layer PDL may also reduce or prevent a short between the first electrode E1 and the second electrode E2. A surface of the pixel definition layer PDL may have a curved shape. The pixel definition layer PDL may include a depressed portion DPA. The depressed portion DPA may overlap between adjacent first electrodes E1. The depressed portion DPA may have a depressed shape; however, exemplary embodiments of the present invention are not limited thereto. For example, the depressed portion DPA may have an opening shape. The opening shape may overlap a surface of the second insulating layer IL2.

The pixel definition layer PDL may be simultaneously etched with the first electrode E1, for example, by using a half-tone mask. Alternatively, the pixel definition layer PDL may be formed by a reflow process using heat.

The encapsulation part EN may cover the organic light-emitting element OLED. The encapsulation part EN may have a single layered structure or a multi-layered structure.

The encapsulation part EN may include an organic material, an inorganic material, or a metal material. The encapsulation part EN is not limited to a single layered structure or a multi-layered structure. For example, the encapsulation part EN may have the substrate shape including a glass, an inorganic material, or an organic material.

In the organic light-emitting diode display according to an exemplary embodiment of the present invention, the second data pattern DP2, the first conductive pattern CP1, the second conductive pattern CP2, the third conductive pattern CP3, and the second capacitor pattern TP2 may each be respectively and substantially simultaneously formed with the first data pattern DP1, the first active layer A1, the second active layer A2, the third active layer A3, and the first capacitor pattern TP1 on the substrate SUB, for example, by using a first half-tone mask. The first contact hole CH1 of the first insulating layer IL1 may be formed by using, for example, a second half-tone mask. The bypass line BL, the driving power source line VDDL, the scan line SL, the first gate electrode G1, the second gate electrode G2, the third gate electrode G3, and the second capacitor electrode CE2 may each be simultaneously formed by using a half-tone third mask. The second contact hole CH2 of the second insulating layer IL2 may be formed by using a fourth half-tone mask. Each of the first electrode E1 and the pixel definition layer PDL may be formed by using a fifth half-tone mask and the reflow process.

By using, for example, five half-tone masks, as the first transistor T1, the second transistor T2, the third transistor T3, the capacitor CST, the data line DL, the scan line SL, the driving power source line VDDL, the bypass line BL, the first insulating layer IL1, the second insulating layer IL2, the organic light-emitting element OLED, the pixel definition layer PDL, and the encapsulation part EN are formed on the substrate SUB, the organic light-emitting diode display according to an exemplary embodiment of the present invention having a reduced manufacturing time and manufacturing cost may be provided.

As the first electrode E1 is disposed on the substrate SUB at a different layer from each of the first transistor T1, the second transistor T2, the third transistor T3, the capacitor CST, the data line DL, the scan line SL, the driving power source line VDDL, and the bypass line BL, an area of the first electrode E1 may be increased without an interference of other elements disposed on the substrate SUB. Thus, by increasing the area of the first electrode E1, the organic light-emitting diode display of which the light emission region of the organic light-emitting element OLED is increased may be provided.

A method of manufacturing an organic light-emitting diode display according to an exemplary embodiment of the present invention will be described in more detail below with reference to FIGS. 4 to 11.

Figure 4:
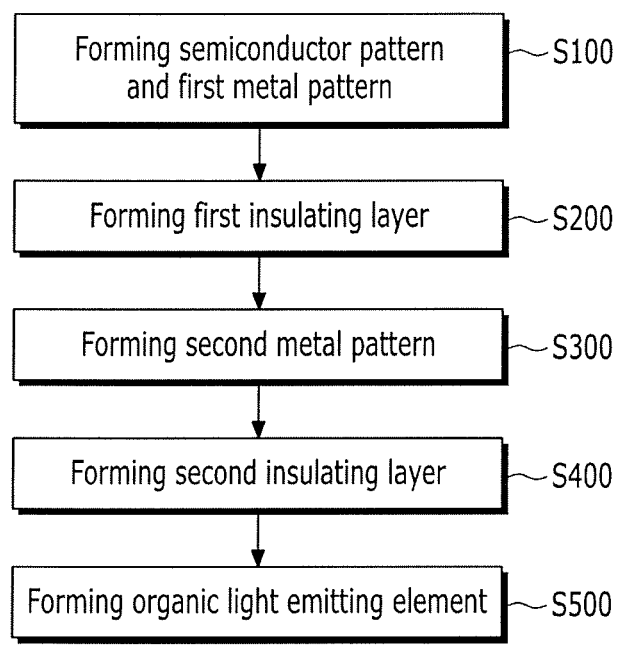
FIG. 4 is a flowchart illustrating a method of manufacturing method an organic light-emitting diode display according to an exemplary embodiment of the present invention.

FIG. 4 is a flowchart illustrating a method of manufacturing an organic light-emitting diode display according to an exemplary embodiment of the present invention. FIGS. 5 to 11 are views illustrating a method of manufacturing an organic light-emitting diode display according to an exemplary embodiment of the present invention.

Figure 5:
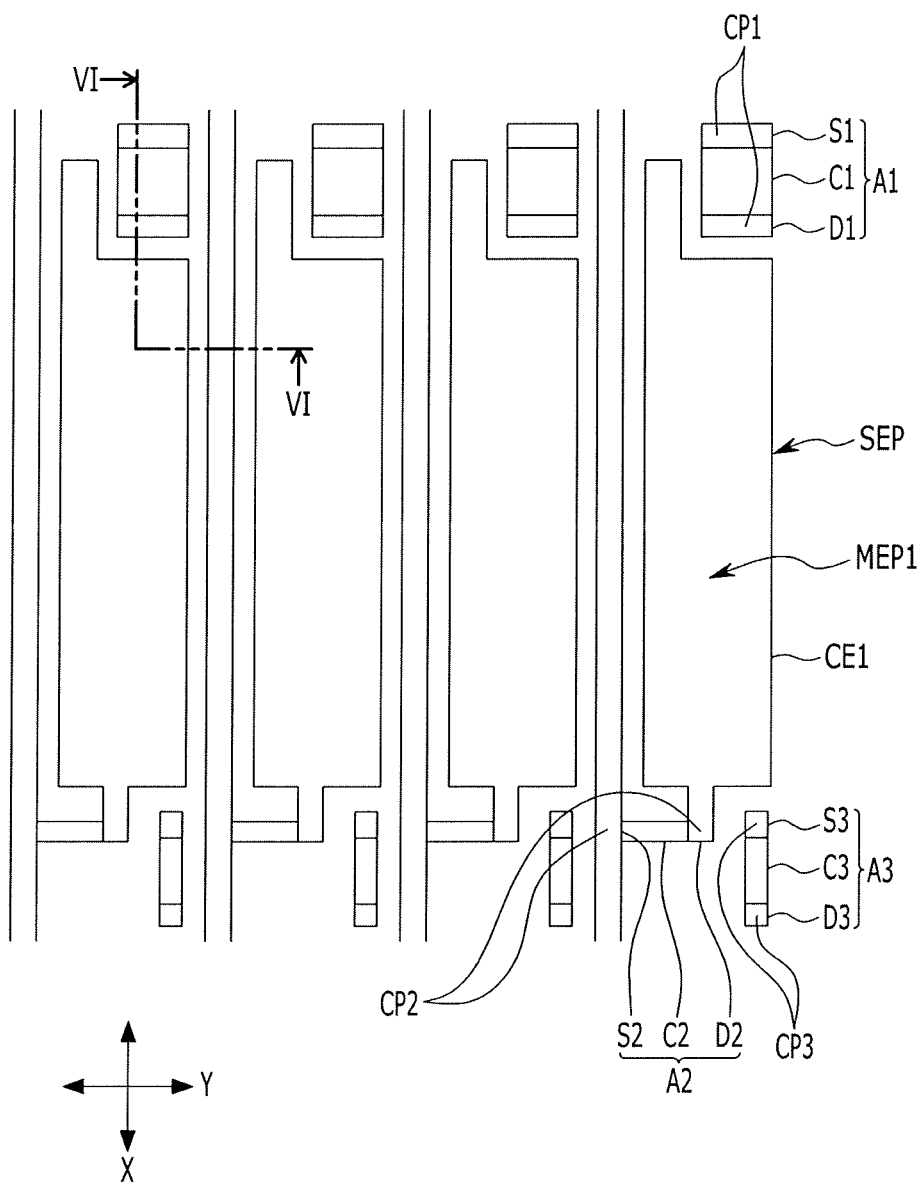
FIG. 5 to FIG. 11 are views illustrating a method of manufacturing an organic light-emitting diode display according to an exemplary embodiment of the present invention.
Figure 6:
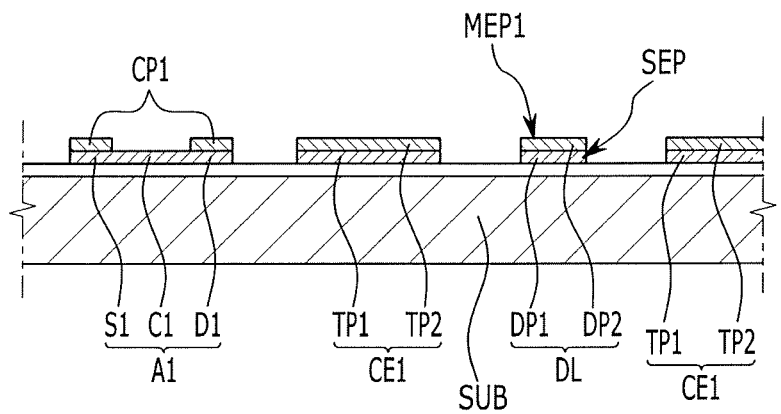

FIG. 6 is a cross-sectional view taken along a line VI-VI of FIG. 5 according to an exemplary embodiment of the present invention.

Referring to FIGS. 5 and 6, a semiconductor pattern SEP and a first metal pattern MEP1 may each be disposed on the substrate SUB, S100. The first metal pattern MEP1 may be in direct contact with the semiconductor pattern SEP. The first metal pattern MEP1 may cover a portion of the semiconductor pattern SEP.

A semiconductor layer and a first metal layer may be disposed on the substrate SUB, for example, by using a deposition process such as sputtering. By using a photolithography process using the first half-tone mask, the semiconductor pattern SEP including each of the first data pattern DP1, the first active layer A1, the second active layer A2, the third active layer A3, and the first capacitor pattern TP1 from the semiconductor layer may be disposed on the substrate SUB. The first metal pattern MEP1 including the second data pattern DP2, the first conductive pattern CP1, the second conductive pattern CP2, the third conductive pattern CP3, and the second capacitor pattern TP2 may be disposed on the first metal layer.

Figure 7:
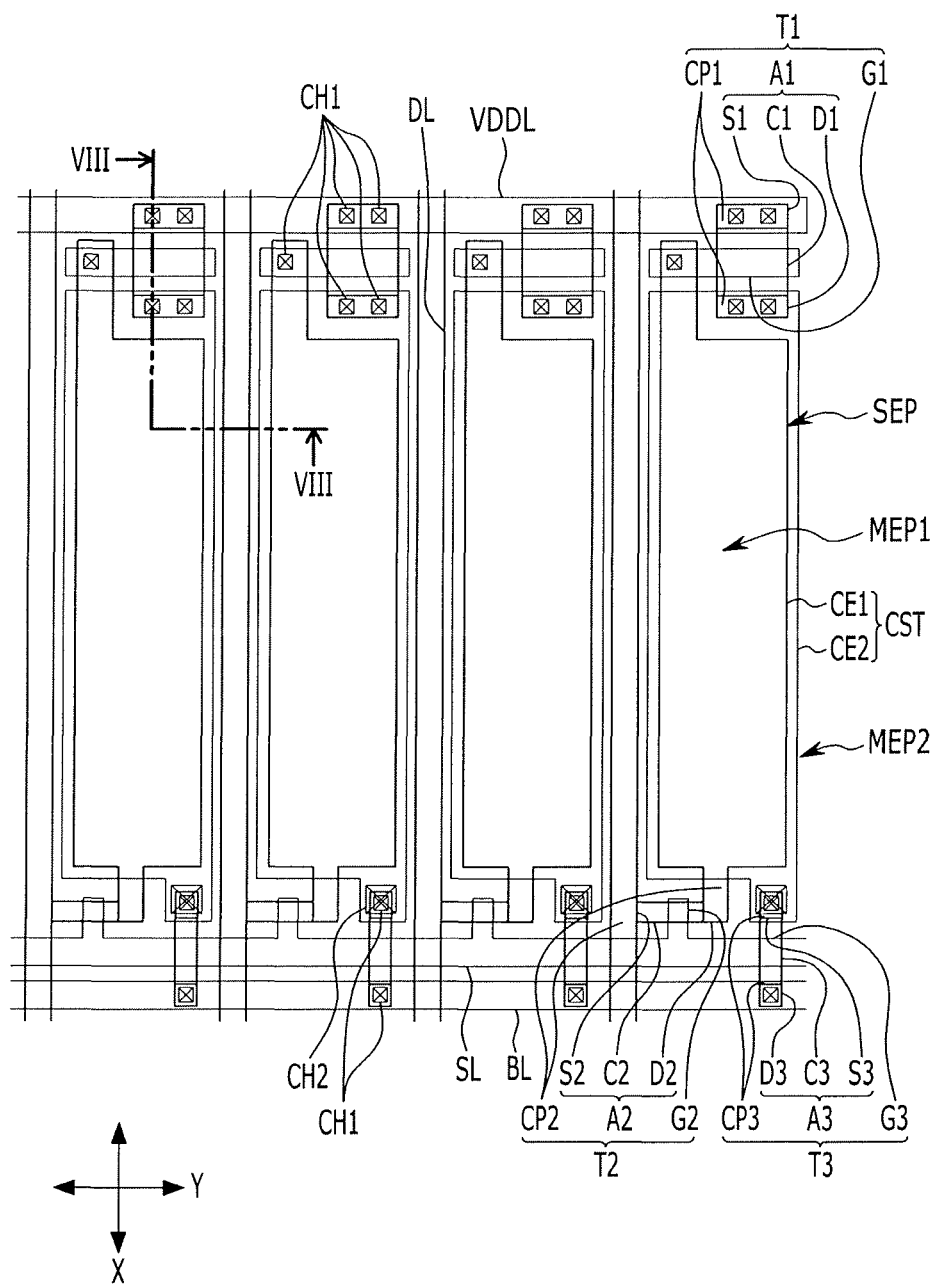
Figure 8:
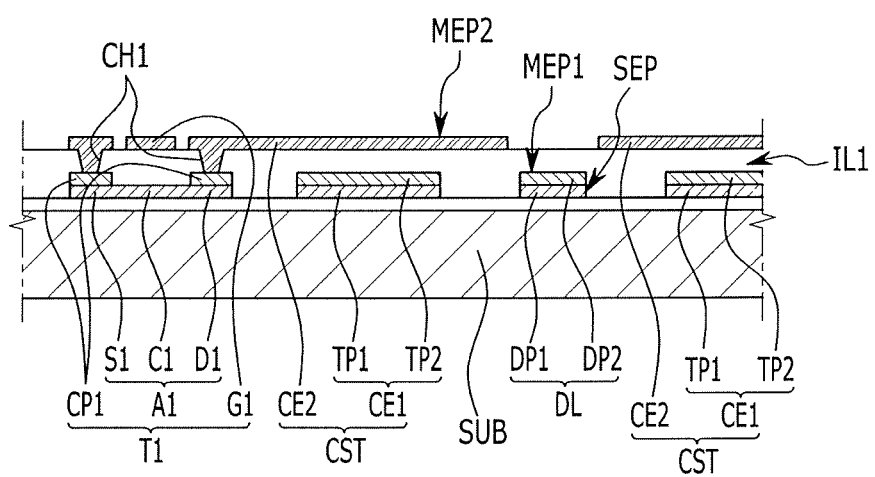

FIG. 8 is a cross-sectional view taken along a line VIII-VIII of FIG. 7 according to an exemplary embodiment of the present invention.

Referring to FIGS. 7 and 8, the first insulating layer IL1 may be disposed on the first metal pattern MEP1, S200. The first insulating layer IL1 may include the first contact hole CH1. The first contact hole CH1 may overlap the part of the first metal pattern MEP1.

The first insulating layer IL1 including the first contact hole CH1 may be disposed on the first metal pattern MEP1, for example, by using the second half-tone mask.

The second metal pattern MEP2 may be disposed on the first insulating layer IL1, S300. The second metal pattern MEP2 may be in direct contact with the first metal pattern MEP1, for example, through the first contact hole CH1.

A second metal layer may be disposed on the first insulating layer IL1, for example, by using a deposition process such as sputtering. The second metal pattern MEP2 including the bypass line BL, the driving power source line VDDL, the scan line SL, the first gate electrode G1, the second gate electrode G2, the third gate electrode G3, the second capacitor electrode CE2 may each be disposed on the second metal layer, for example, by using a photolithography process using the third half-tone mask.

Figure 9:
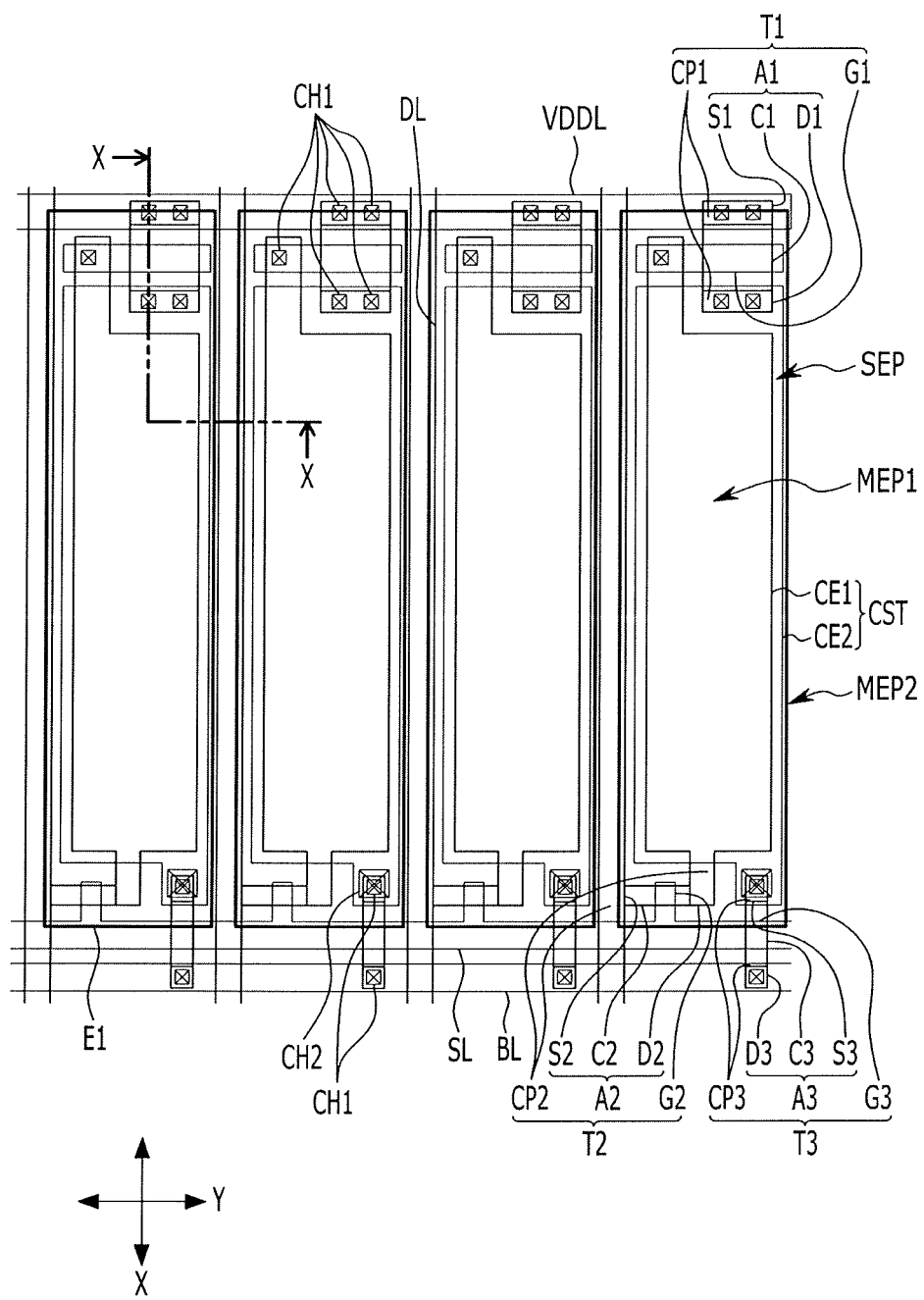
Figure 10:
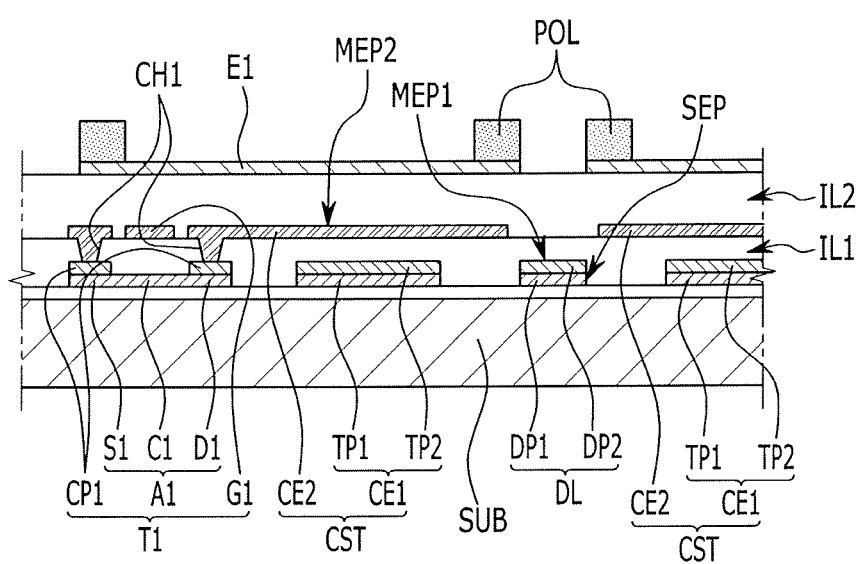

FIG. 10 is a cross-sectional view taken along a line X-X of FIG. 9 according to an exemplary embodiment of the present invention.

Referring to FIGS. 9 and 10, the second insulating layer may be disposed on the second metal pattern MEP2, S400. The second insulating layer may include the second contact hole CH2. The second contact hole may overlap the part of the second metal pattern MEP2.

The second insulating layer IL2 including the second contact hole CH2 may be disposed on the second metal pattern MEP2, for example, by using the fourth half-tone mask.

Figure 11:
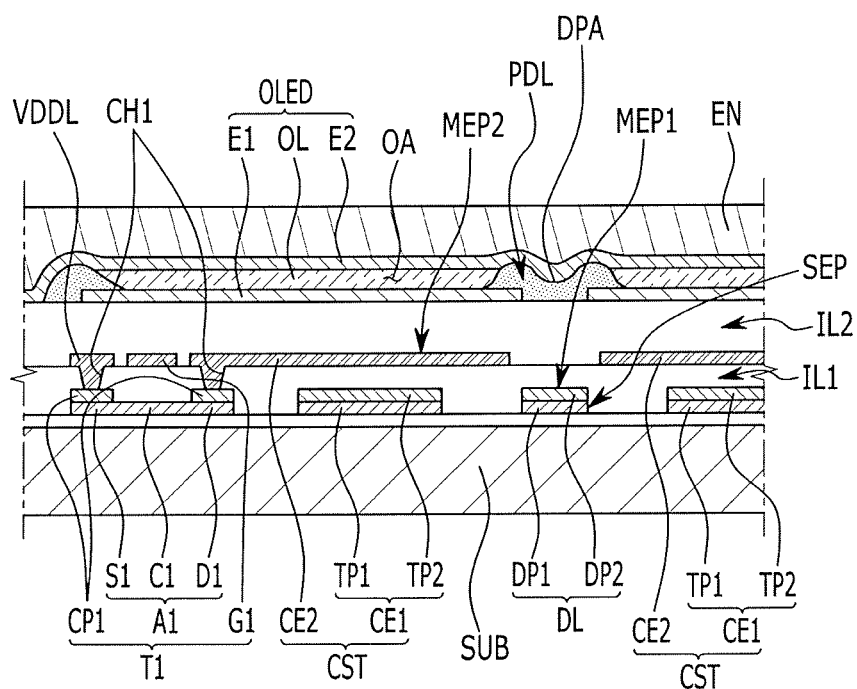

Referring to FIGS. 10 and 11, the organic light-emitting element OLED may be disposed on the second insulating layer IL2, S500. The organic light-emitting element OLED may be in direct contact with the second metal pattern MEP2, for example, through the second contact hole CH2.

Referring to FIG. 10, a first electrode layer and an organic layer may each be disposed on the second insulating layer IL2. The first electrode E1 of the first electrode layer may be formed by using a photolithography process using the fifth half-tone mask. The organic layer POL etched from the organic layer may be formed. The etched organic layer POL may overlap an end of the first electrode E1. As illustrated in FIG. 11, by reflowing the etched organic layer POL using the reflow process, the pixel definition layer PDL enclosing the end of the first electrode E1 may be formed. As the etched organic layer POL reflows, the surface of the pixel definition layer PDL may have a curved shape. The depressed portion DPA of the pixel definition layer PDL may be disposed between adjacent first electrodes E1. The organic emission layer OL and the second electrode E2 may each be disposed on the first electrode E1 to form the organic light-emitting element OLED.

An encapsulation part EN may be disposed on the organic light-emitting element OLED.

By using, for example, five half-tone masks, each of the semiconductor pattern SEP, the first metal pattern MEP1, the first insulating layer IL1, the second metal pattern MEP2, the second insulating layer IL2, and the organic light-emitting element OLED may be disposed on the substrate SUB. Thus, an organic light-emitting diode display including the first transistor T1, the second transistor T2, the third transistor T3, the capacitor CST, the data line DL, the scan line SL, the driving power source line VDDL, the bypass line BL, the first insulating layer IL1, the second insulating layer IL2, the organic light-emitting element OLED, the pixel definition layer PDL, and the encapsulation part EN, may be formed thereby providing the manufacturing method of the organic light emitting diode display with the reduced manufacturing time and manufacturing cost.

By using the fifth half-tone mask, since the first electrode E1 is disposed on the substrate SUB at a different layer from each of the first transistor T1, the second transistor T2, the third transistor T3, the capacitor CST, the data line DL, the scan line SL, the driving power source line VDDL, and the bypass line BL, a method of manufacturing an organic light-emitting diode display in which the area of the first electrode E1 may be increased without the interference of other elements of the organic light-emitting diode display.

By increasing the area of the first electrode E1, the manufacturing method of the organic light-emitting diode display in which the light emission region of the organic light-emitting element OLED is increased may be provided. Additionally, a manufacturing time and cost of the organic light-emitting diode display may be reduced.

While exemplary embodiments of the present invention have been described herein, it is to be understood that the present invention is not limited thereto, but is intended to cover various modifications and equivalent arrangements included within the spirit and scope of the present invention as recited in the attached claims.

What is claimed is:

1. An organic light-emitting diode display, comprising:
a substrate;
a first transistor positioned on the substrate and comprising a first active layer including a first source region, a first channel region extending from the first source region, a first drain region extending from the first channel region, a first conductive pattern, and a first gate electrode positioned on the first active layer;
a driving power source line positioned on the same layer as the first gate electrode; and
an organic light-emitting element connected to the first transistor,
wherein the first conductive pattern is directly in contact with the first source region and the first drain region and is directly connected to the driving power source line.

2. The organic light-emitting diode display of claim 1, wherein the first conductive pattern does not overlap the first channel region.

3. The organic light-emitting diode display of claim 1, further comprising:
a second transistor, wherein the second transistor includes:
a second active layer including a second drain region connected to the first gate electrode;
a second channel region extending from the second drain region;
a second source region extending from the second channel region;
a second conductive pattern in contact with the second active layer and covering the second source region and the second drain region; and
a second gate electrode positioned on the second active layer.

4. The organic light-emitting diode display of claim 3, wherein the second conductive pattern does not overlap the second channel region.

5. The organic light-emitting diode display of claim 3, wherein the second active layer is positioned at the same layer as the first active layer, and
the second conductive pattern is positioned at the same layer as the first conductive pattern.

6. The organic light-emitting diode display of claim 1, wherein the organic light-emitting element includes:
a first electrode connected to the first transistor;
an organic emission layer positioned on the first electrode;
a second electrode positioned on the organic emission layer; and
a pixel definition layer including an opening overlapping a part of the first electrode.

7. The organic light-emitting diode display of claim 6, wherein the first electrode includes a plurality of first electrodes, and the pixel definition layer includes a depressed portion, the depressed portion overlapping adjacent first electrodes.

8. The organic light-emitting diode display of claim 6, wherein a surface of the pixel definition layer has a curved shape.

9. The organic light-emitting diode display of claim 1, wherein the first active layer includes polysilicon or an oxide semiconductor.

10. The organic light-emitting diode display of claim 1, wherein the first conductive pattern has an island shape.

11. An organic light-emitting diode display, comprising:
a substrate;
a first transistor positioned on the substrate, wherein the first transistor includes a first active layer including a first source region, a first channel region extending from the first source region, a first drain region extending from the first channel region, a first conductive pattern, and a first gate electrode positioned on the first active layer;
an organic light-emitting element connected to the first transistor;
a second transistor, wherein the second transistor includes: a second active layer including a second drain region connected to the first gate electrode; a second channel region extending from the second drain region; a second source region extending from the second channel region; a second conductive pattern in contact with the second active layer and covering the second source region and the second drain region; and a second gate electrode positioned on the second active layer;
a first capacitor electrode including a first capacitor pattern connecting the first gate electrode and the second drain region to each other, and a second capacitor pattern in contact with the first capacitor pattern and covering the first capacitor pattern; and a second capacitor electrode positioned on the first capacitor electrode and connecting the first drain region and the organic light-emitting element to each other, wherein the first conductive pattern is in contact with the first active layer and covers the first source region and the first drain region, and wherein the first capacitor electrode is disposed at the same layer as the first active layer and the second active layer.

12. The organic light-emitting diode display of claim 11, wherein the second capacitor pattern is positioned at the same layer as the first conductive pattern and the second conductive pattern, and the second capacitor electrode is positioned at the same layer as the first gate electrode and the second gate electrode.

13. An organic light-emitting diode display, comprising:
a substrate;
a first transistor positioned on the substrate, wherein the first transistor includes a first active layer including a first source region, a first channel region extending from the first source region, a first drain region extending from the first channel region, a first conductive pattern, and a first gate electrode positioned on the first active layer;
an organic light-emitting element connected to the first transistor,
a second transistor, wherein the second transistor includes: a second active layer including a second drain region connected to the first gate electrode; a second channel region extending from the second drain region; a second source region extending from the second channel region; a second conductive pattern in contact with the second active layer and covering the second source region and the second drain region; and a second gate electrode positioned on the second active layer;
a data line extending in a first direction along a substrate, the data line comprising:
a first data pattern connected to the second source region and positioned at the same layer as the second active layer; and
a second data pattern in contact with the first data pattern and covering the first data pattern, wherein
the first conductive pattern is in contact with the first active layer and covers the first source region and the first drain region.

14. The organic light-emitting diode display of claim 13, wherein the second data pattern is positioned at the same layer as the first conductive pattern and the second conductive pattern.

15. The organic light-emitting diode display of claim 13, further comprising
a scan line extending in a second direction along the substrate, connected to the second gate electrode, and positioned at the same layer as the second gate electrode,
wherein the second direction crosses the first direction.

16. The organic light-emitting diode display of claim 15, further comprising
a driving power source line disposed on the substrate and separated from the scan line, extending in the second direction and configured to be connected to the first source region, and disposed at substantially the same layer as the scan line.

17. The organic light-emitting diode display of claim 16, further comprising
a bypass line disposed on the substrate and separated from each of the scan line and the driving power source line, extending in the second direction and connected to the organic light-emitting element, and positioned at the same layer as the driving power source line.

* * * * *